(12) United States Patent
Jung et al.

(10) Patent No.: US 11,308,831 B2
(45) Date of Patent: Apr. 19, 2022

(54) LED DISPLAY PANEL AND REPAIRING METHOD

(71) Applicant: SAMSUNG ELECTRONICS CO., LTD., Suwon-si (KR)

(72) Inventors: Youngki Jung, Suwon-si (KR); Jinhee Kang, Suwon-si (KR); Jinho Kim, Suwon-si (KR); Sangmin Shin, Suwon-si (KR); Chulgyu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/824,121

(22) Filed: Mar. 19, 2020

(65) Prior Publication Data

US 2020/0302841 A1    Sep. 24, 2020

(30) Foreign Application Priority Data

Mar. 19, 2019  (KR) .......................... 10-2019-0031412

(51) Int. Cl.
  *G09G 3/00*  (2006.01)
  *H01L 33/62*  (2010.01)
  *G09G 3/32*  (2016.01)

(52) U.S. Cl.
  CPC .............. *G09G 3/006* (2013.01); *G09G 3/32* (2013.01); *H01L 33/62* (2013.01); *H01L 2933/0066* (2013.01)

(58) Field of Classification Search
  CPC .... G09G 3/3266; G09G 3/32; G09G 2330/08; G09G 2330/04; G09G 3/006; G09G 3/00;
  (Continued)

(56) References Cited

U.S. PATENT DOCUMENTS 6,175,346 B1 *  1/2001  Chiu ........................ G09G 3/32
                                                                345/100
6,366,116 B1 *  4/2002  Juang ................... G09G 3/3216
                                                                326/112
(Continued)

FOREIGN PATENT DOCUMENTS

EP   3 023 973 A1   5/2016
JP   10-161601 A    6/1998
(Continued)

OTHER PUBLICATIONS

International Search Report (PCT/ISA/210) dated Jul. 13, 2020 issued by the International Searching Authority in International Application No. PCT/KR2020/003764.
(Continued)

*Primary Examiner* — Vinh T Lam
(74) *Attorney, Agent, or Firm* — Sughrue Mion, PLLC

(57) ABSTRACT

A display panel is provided. The display panel may include a glass, a driver formed on a first surface of the glass, and a circuit layer formed on a second surface of the glass. The circuit layer may include a plurality of pixel circuits configured to drive a plurality of micro light emitting diodes (LEDs) forming a plurality of pixels of the display panel; a plurality of driving circuits which are respectively connected to the driver via wiring formed over at least one side surface of the glass, and configured to supply driving signals to the plurality of pixel circuits based on signals received from the driver; and a plurality of redundancy driving circuits connected to the plurality of respective driving circuits in parallel, the plurality of redundancy driving circuits having a same circuit structure as the plurality of respective driving circuits.

19 Claims, 12 Drawing Sheets

(58) Field of Classification Search
CPC .................. H01L 33/62; H01L 25/167; H01L 2933/0066; H01L 27/15
See application file for complete search history.

(56) References Cited

U.S. PATENT DOCUMENTS

| | | | |
|---|---|---|---|
| 7,375,724 B2 | 5/2008 | Jiang et al. | |
| 8,749,459 B2* | 6/2014 | Shin | G09G 3/3225 345/82 |
| 9,047,841 B2* | 6/2015 | Song | G09G 3/3677 |
| 9,087,478 B2* | 7/2015 | Jeong | G09G 3/2003 |
| 9,159,285 B2 | 10/2015 | Chang et al. | |
| 9,189,992 B2 | 11/2015 | Hwang et al. | |
| 9,286,847 B2 | 3/2016 | Yu | |
| 9,495,903 B2* | 11/2016 | Kwon | G09G 3/3225 |
| 9,495,912 B2* | 11/2016 | Kim | G09G 3/3275 |
| 9,508,300 B2* | 11/2016 | Choi | H01L 21/823475 |
| 9,548,026 B2* | 1/2017 | Jang | G09G 3/3266 |
| 9,966,000 B2 | 5/2018 | Fan et al. | |
| 10,706,753 B2 | 7/2020 | Lee et al. | |
| 2006/0022908 A1* | 2/2006 | Schwanenberger | G09G 3/20 345/76 |
| 2006/0192585 A1* | 8/2006 | Chen | G09G 3/006 324/760.01 |
| 2008/0036717 A1* | 2/2008 | Moon | G09G 3/3677 345/87 |
| 2010/0238094 A1 | 9/2010 | Cho et al. | |
| 2011/0128268 A1* | 6/2011 | Kim | H01L 27/3279 345/211 |
| 2013/0106828 A1* | 5/2013 | Kim | G09G 3/3233 345/212 |
| 2013/0120334 A1* | 5/2013 | Kim | G09G 3/3688 345/208 |
| 2013/0278572 A1* | 10/2013 | Lee | G09G 3/3648 345/204 |
| 2014/0132487 A1* | 5/2014 | Park | H01L 27/3223 345/55 |
| 2014/0191238 A1* | 7/2014 | Hwang | H01L 29/41775 257/59 |
| 2014/0239823 A1* | 8/2014 | Ahn | G09G 3/3233 315/161 |
| 2014/0292827 A1* | 10/2014 | Kang | G09G 3/3233 345/690 |
| 2014/0320553 A1* | 10/2014 | Eom | G09G 3/3208 345/690 |
| 2014/0346475 A1* | 11/2014 | Cho | H01L 27/326 257/40 |
| 2014/0347401 A1* | 11/2014 | Hwang | G09G 3/3233 345/690 |
| 2015/0102302 A1* | 4/2015 | Kim | G09G 3/3225 257/40 |
| 2015/0102312 A1* | 4/2015 | Lee | H01L 27/3223 257/40 |
| 2015/0102985 A1* | 4/2015 | Kim | G09G 3/3216 345/76 |
| 2015/0103103 A1* | 4/2015 | Kim | G09G 3/3233 345/690 |
| 2015/0109189 A1* | 4/2015 | Hwang | G09G 3/3225 345/78 |
| 2015/0130787 A1* | 5/2015 | Chung | G09G 3/3225 345/214 |
| 2015/0145905 A1* | 5/2015 | Kim | G09G 3/3208 345/694 |
| 2015/0154899 A1* | 6/2015 | Chang | G09G 3/3648 345/76 |
| 2015/0154933 A1* | 6/2015 | Bae | G09G 3/3611 345/618 |
| 2015/0170562 A1* | 6/2015 | In | G09G 3/2029 345/80 |
| 2015/0243214 A1* | 8/2015 | Jeong | G09G 3/006 345/214 |
| 2015/0248861 A1* | 9/2015 | Kong | G09G 3/3233 345/212 |
| 2015/0262526 A1* | 9/2015 | Park | G09G 3/3233 345/76 |
| 2015/0294618 A1* | 10/2015 | Park | G09G 3/3291 345/214 |
| 2015/0294620 A1* | 10/2015 | Cho | G09G 3/3233 345/690 |
| 2015/0364116 A1* | 12/2015 | Kong | G09G 3/3233 345/205 |
| 2015/0364531 A1* | 12/2015 | Kim | H01L 27/3276 257/40 |
| 2015/0379908 A1* | 12/2015 | Kim | G09G 3/006 345/84 |
| 2016/0019826 A1* | 1/2016 | Kim | G09G 3/20 345/214 |
| 2016/0078810 A1* | 3/2016 | Park | G09G 3/3275 345/215 |
| 2016/0078811 A1* | 3/2016 | Park | G09G 3/3233 345/78 |
| 2016/0104409 A1* | 4/2016 | Jeon | H01L 27/1222 345/690 |
| 2016/0104421 A1* | 4/2016 | Park | G09G 3/3233 345/212 |
| 2016/0104430 A1* | 4/2016 | Park | G09G 3/3233 345/204 |
| 2016/0104431 A1* | 4/2016 | Park | G09G 3/3233 345/78 |
| 2016/0118455 A1* | 4/2016 | Kang | H01L 27/3276 257/40 |
| 2016/0133193 A1* | 5/2016 | Lee | G09G 3/3275 345/694 |
| 2016/0163243 A1* | 6/2016 | Park | G09G 3/3258 345/205 |
| 2016/0163255 A1* | 6/2016 | Kim | G09G 3/3291 345/212 |
| 2016/0189585 A1* | 6/2016 | Na | G09G 3/3233 345/204 |
| 2016/0189644 A1* | 6/2016 | So | G09G 3/3233 345/205 |
| 2016/0203762 A1* | 7/2016 | Kim | G09G 3/3291 345/76 |
| 2016/0217735 A1* | 7/2016 | Park | G09G 3/2003 |
| 2016/0225312 A1* | 8/2016 | Byun | G09G 3/006 |
| 2016/0233286 A1* | 8/2016 | Kim | H01L 27/3276 |
| 2016/0321990 A1* | 11/2016 | Kim | G09G 3/3233 |
| 2016/0372029 A1* | 12/2016 | Park | G09G 3/3233 |
| 2017/0054111 A1* | 2/2017 | Kim | H01L 27/3276 |
| 2017/0062544 A1* | 3/2017 | Kang | H01L 27/3223 |
| 2018/0151663 A1* | 5/2018 | Kim | H01L 27/124 |
| 2018/0182333 A1* | 6/2018 | Ahn | G02F 1/134309 |
| 2018/0204895 A1* | 7/2018 | Lin | H01L 27/3248 |
| 2018/0323180 A1 | 11/2018 | Cok | |
| 2019/0005870 A1* | 1/2019 | Son | H01L 33/62 |
| 2019/0019000 A1* | 1/2019 | Lee | H01L 27/14678 |
| 2019/0027076 A1 | 1/2019 | Lee et al. | |
| 2021/0057391 A1* | 2/2021 | Behringer | G09G 3/32 |

FOREIGN PATENT DOCUMENTS

| | | |
|---|---|---|
| JP | 2018-141944 A | 9/2018 |
| KR | 10-2009-0006532 A | 1/2009 |
| KR | 10-0951894 B1 | 4/2010 |
| KR | 101201294 B1 | 11/2012 |
| KR | 10-2014-0139327 A | 12/2014 |
| KR | 10-2015-0063748 A | 6/2015 |
| KR | 10-2016-0029541 A | 3/2016 |
| KR | 10-1861609 B1 | 5/2018 |
| KR | 1020190009457 A | 1/2019 |
| WO | 2017/053317 A1 | 3/2017 |

OTHER PUBLICATIONS

Written Opinion (PCT/ISA/237) dated Jul. 13, 2020 issued by the International Searching Authority in International Application No. PCT/KR2020/003764.

(56) References Cited

OTHER PUBLICATIONS

Communication dated Jan. 31, 2022 by the European Patent Office in counterpart European Patent Application No. 20774054.9.

* cited by examiner

1

LED DISPLAY PANEL AND REPAIRING METHOD

CROSS-REFERENCE TO RELATED APPLICATION(S)

This application is based on and claims priority under 35 U.S.C. § 119 to Korean Patent Application No. 10-2019-0031412, filed on Mar. 19, 2019, in the Korean intellectual Property Office, the disclosure of which is incorporated by reference herein in its entirety.

BACKGROUND

1. Field

The disclosure relates to a light emitting diode (LED) display panel, and more particularly, to a structure of an LED display panel in which driving circuits for driving micro LEDs can be easily repaired and a repairing method thereof.

2. Description of Related Art

By using one or more LED display panels with no bezel, a plurality of modular display panels may be used in various ways, for example, to provide one large screen or to be separated from each other.

SUMMARY

In accordance with an aspect of the disclosure, there is provided a display panel including a glass, a driver formed on a first surface of the glass, and a circuit layer formed on a second surface of the glass. The circuit layer may include a plurality of pixel circuits configured to drive a plurality of micro light emitting diodes (LEDs) forming a plurality of pixels of the display panel; a plurality of driving circuits which are respectively connected to the driver via wiring formed over at least one side surface of the glass, and configured to supply driving signals to the plurality of pixel circuits based on signals received from the driver; and a plurality of redundancy driving circuits connected to the plurality of respective driving circuits in parallel, the plurality of redundancy driving circuits having a same circuit structure as the plurality of respective driving circuits.

The plurality of redundancy driving circuits are connected, via additional wiring, to the driver and to the respective plurality of pixel circuits that are connected to the plurality of driving circuits. The plurality of pixel circuits are configured to be driven based on driving signals received from the plurality of driving circuits and the plurality of redundancy driving circuits.

Based on a connection between a first driving circuit of the plurality of driving circuits and a first pixel circuit of the plurality of pixel circuits being opened, the first pixel circuit is configured to be driven by a driving signal received from a first redundancy driving circuit among the plurality of redundancy driving circuits corresponding to the first driving circuit.

Based on a connection between a first redundancy driving circuit of the plurality of redundancy driving circuits and a first pixel circuit of the plurality of pixel circuits being opened, the first pixel circuit is configured to be driven based on a driving signal received from a first driving circuit among the plurality of driving circuits corresponding to the first redundancy driving circuit.

The plurality of redundancy driving circuits are connected, in an insulated welding form, to the driver and to the plurality of pixel circuits.

The plurality of micro LEDs form the plurality of pixels arranged in a matrix on the display panel, and the plurality of driving circuits are grouped into a first group of the plurality of driving circuits for driving corresponding pixel circuits for each row of the matrix and a second group of the plurality of driving circuits for driving corresponding pixel circuits for each column of the matrix.

The first group of the plurality of driving circuits are configured to sequentially supply driving signals for driving the pixel circuits for each row of the matrix based on a clock signal received from the driver, and the second group of the plurality of driving circuits are configured to sequentially select respective pixel circuits corresponding to red (R), green (G) and blue (B) sub-pixels that form each pixel included in a row to which driving signals are supplied from the first group based on the clock signal received from the driver, and sequentially supply data signals received from the driver to the selected pixel circuits.

The circuit layer may further include an electrostatic discharge (ESD) circuit configured to prevent static electricity of the display panel and a redundancy ESD circuit corresponding to the ESD circuit.

In accordance with an aspect of the disclosure, there is provided a method of manufacturing a display panel. The method may include forming a circuit layer on a first surface of a glass, the circuit layer including a plurality of pixel circuits, a plurality of driving circuits configured to drive the plurality of pixel circuits, and a plurality of redundancy driving circuits connected in parallel to the plurality of driving circuits with a same circuit structure; forming wiring lines connected from the plurality of driving circuits on the first surface of the glass through at least one side surface of the glass to a second surface of the glass, respectively; forming a plurality of micro light emitting diodes (LEDs) on the circuit layer to be driven by the plurality of pixel circuits; and forming a driver on the second surface of the glass to be electrically connected to the wiring lines connected to the plurality of driving circuits.

The method may further include, based on an abnormality occurring in a first driving circuit of the plurality of driving circuits, opening a connection between the first driving circuit and a first pixel circuit among the plurality of pixel circuits connected to the first driving circuit, and the first pixel circuit may be configured to be driven based on a driving signal received from a first redundancy driving circuit among the plurality of redundancy driving circuits corresponding to the first driving circuit.

The method may further include, based on an abnormality occurring in a first redundancy driving circuit of the plurality of redundancy driving circuits, opening a connection between the first redundancy driving circuit and a first pixel circuit among the plurality of pixel circuits connected to the first redundancy driving circuit, and the first pixel circuit is configured to be driven based on a driving signal received from a first driving circuit among the plurality of driving circuits corresponding to the first abnormal redundancy driving circuit.

The plurality of micro LEDs form the plurality of pixels arranged in a matrix on the display panel, and the forming of the circuit layer may further include forming a first group of the plurality of driving circuits configured to drive corresponding pixel circuits for each row of the matrix and a second group of the plurality of driving circuits configured to drive corresponding pixel circuits for each column of the matrix.

The forming of the circuit layer may further include forming the first group of the plurality of driving circuits to sequentially supply driving signals for driving the pixel circuits for each row of the matrix based on a clock signal received from the driver, and forming the second group of the plurality of driving circuits to sequentially select respective pixel circuits corresponding to red (R), green (G) and blue (B) sub-pixels that form each pixel included in a row to which driving signals are supplied from the first group of the plurality of driving circuits based on the clock signal received from the driver, and to sequentially supply data signals received from the driver to the selected pixel circuits.

The forming of the circuit layer may further include forming an electrostatic discharge (ESD) circuit configured to prevent static electricity of the display panel and a redundancy ESD circuit for the corresponding ESD circuit.

BRIEF DESCRIPTION OF THE DRAWINGS

The above and other aspects, features and advantages of certain embodiments of the disclosure will become more apparent from the following description, taken in conjunction with reference to the accompanying drawings, in which.

DETAILED DESCRIPTION

Figure 1A:
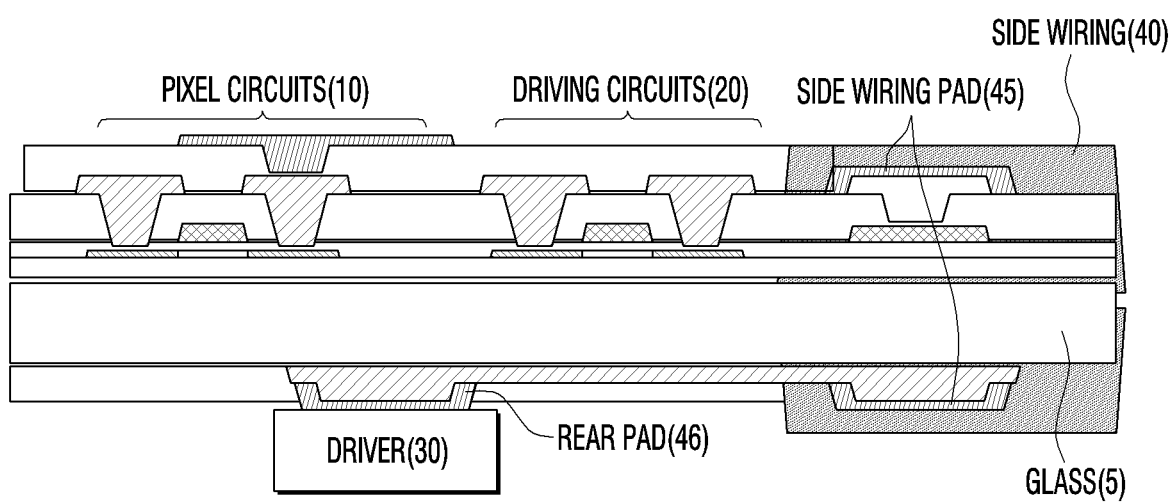
FIG. 1A is a diagram illustrating an example of a chip-on-glass (COG)-type display panel to which side wiring is applied according to an embodiment.

The disclosure provides a display panel of which a damaged part can be easily restored, when the display panel is at least partially damaged due to an electrostatic discharge (ESD) or the like that may occur in the process of manufacturing a chip-on-glass (COG)-type modular display panel.

In the disclosure, when it is determined that the detailed description of the related well-known technology may unnecessarily obscure the gist of the disclosure, the detailed description thereof will be omitted. Also, an overlapping description of the same configuration will be omitted.

The suffixes "-or" "-er" and "unit" used for elements described herein may be assigned to facilitate understanding of the disclosure, and should not be construed as having distinct meanings or roles.

Terms used in the disclosure are used to describe embodiments, and are not intended to restrict and/or limit the disclosure. Singular forms are intended to include plural forms unless the context clearly indicates otherwise.

It is to be understood that term "include", "have" or the like used in the disclosure specifies the presence of features, numerals, steps, operations, elements, parts mentioned in the disclosure, or combinations thereof, but do not preclude the presence or addition of one or more other features, numerals, steps, operations, elements, parts, or combinations thereof.

The terms "first", "second", and the like used in the disclosure may modify various elements irrespective of sequence and/or importance, not limiting the elements. These expressions may be used to distinguish one element from another element.

It should further be understood that when an element (e.g. a first element) is referred to as being "(operatively or communicatively) coupled with/to" or "connected to" another element (e.g. a second element), it means that an element is coupled with/to or connected to another element directly or via an intervening element (e.g. a third element). On the other hand, it should be understood that when an element (e.g. a first element) is referred to as being "directly coupled with/to" or "directly connected to" another element (e.g. a second element), it means that there is no intervening element (e.g. a third element) between an element and another element.

Unless otherwise defined, the terms used for describing the embodiments of the disclosure have the same meanings as commonly understood by those skilled in the art.

The display panel of the disclosure may be installed and applied in a single unit to a wearable device, a portable device, a hand-held device, or any of various electronic products or electronics requiring a display, or may be applied in a plural number through assembling arrangement thereof in a matrix type to a display device such as a monitor for a personal computer (PC), a high-resolution TV, signage or an electronic display.

Hereinafter, a display panel according to various embodiments of the disclosure will be described in detail with reference to the accompanying drawings.

FIG. 1A is a side view illustrating an example of a COG-type display panel to which side wiring is applied according to an embodiment.

Referring to FIG. 1A, pixel circuits 10 for applying a voltage/current to light emitting diodes and driving circuits 20 for driving the pixel circuits 10 formed on a glass 5 may be connected to each other. In this case, the pixel circuits 10 and the driving circuits 20 may be included in the same circuit layer.

The light emitting diodes may be formed on the circuit layer including the pixel circuits 10 and the driving circuits 20.

In addition, the driving circuits 20 may be connected to a driver 30 on a rear surface of the glass 5 via side wiring 40. Specifically, the side wiring 40 may be connected to each of the driving circuits 20 and the driver 30 through side wiring pads 45 and a rear pad 46.

In FIG. 1A, the driving circuits 20 may be configured to collectively drive the pixel circuits 10 on a column or row basis, and the driver 30 may be configured to control operations of the driving circuits 20 based on image data and clock signals or the like.

In FIG. 1A, an area corresponding to the circuit layer including the pixel circuits 10 and the driving circuits 20 may be collectively referred to as an active area.

Figure 1B:
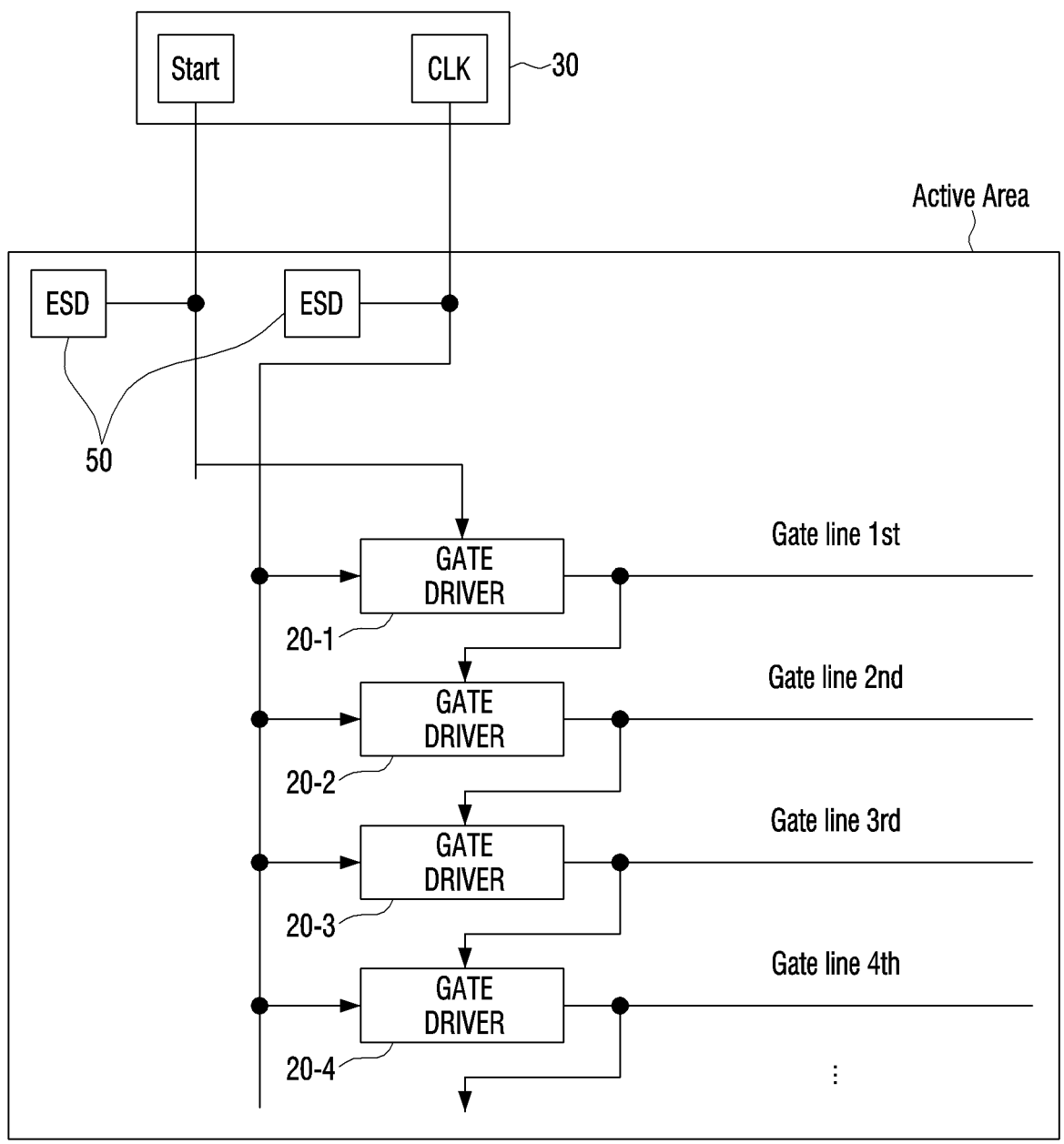
FIG. 1B is a block diagram schematically illustrating an active area of the COG-type display panel to which the side wiring is applied according to an embodiment.

FIG. 1B is a block diagram illustrating a partial area of an active area according to an embodiment of the disclosure.

Referring to FIG. 1B, driving circuits, such as gate drivers 20-1, 20-2, 20-3 and 20-4, for driving the pixel circuits, which are connected to the light emitting diodes arranged in a matrix form, for each row may be included in the active area. The driving circuits may further include circuits, such as multiplexer (MUX) circuits, for driving the pixel circuits for each column of corresponding light emitting diodes.

Referring to FIG. 1B, an electrostatic discharge (ESD) circuit 50 for preventing static electricity of the display panel may be further included in the active area.

Referring to FIG. 1B, the gate drivers 20-1, 20-2, 20-3 and 20-4 may receive a start signal "Start" and/or a clock signal "CLK" through the side wiring from the driver 30 disposed on the rear surface of the glass 5 to drive the plurality of pixel circuits.

The display panel as in FIGS. 1A and/or 1B may be manufactured/implemented by forming the active area in which the pixel circuits 10 and the driving circuits 20 are included. For example, on the glass 5, the side wiring 40, the side wiring pads 45 and the rear pad 46 may be disposed, and then the plurality of light emitting diodes on a higher layer than that of the active area may be transferred. Thereafter, the driver 30 on the rear surface of the glass 5 may be connected to the rear pad 46 and the wiring 40.

However, before the driver 30 is connected, there is possibility that an ESD may occur and enter the active area through the side wiring pads 45, the rear pad 46, or the like. Even though the ESD circuit 50 is provided on the active area as shown in FIG. 1B, at least some of the driving circuits may be damaged as a result of not coping with more powerful ESD. This is because, unlike the driver 30 that is capable of having a relatively high-performance ESD circuit, the active area, which corresponds to a relatively thin circuit layer, has a small space so that the ESD circuit 50 provided therein has limitations in its performance.

This may result in poor image quality such as bright lines/dark lines for at least a portion of the display panel.

Hereinafter, various embodiments of a display panel derived to solve the above-described problem will be described.

Figure 2A:
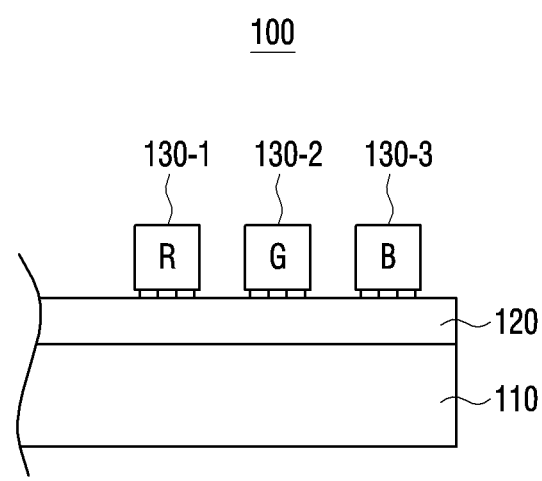
FIG. 2A is a block diagram illustrating a structure of a display panel according to an embodiment.
Figure 2B:
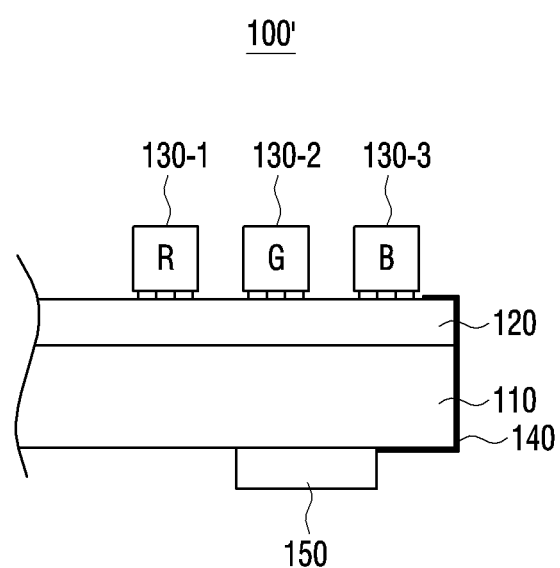
FIG. 2B is a block diagram illustrating a structure of a display panel according to an embodiment.

FIGS. 2A and 2B are block diagrams illustrating a structure of a display panel according to an embodiment of the disclosure. FIGS. 2A and 2B schematically illustrate a side view of a portion of the display panel according to an embodiment.

Referring to FIG. 2A, a display panel 100 may include a glass 110 made of a light transmissive material and a circuit layer 120 formed on one surface of the glass 110.

The circuit layer 120 may include a plurality of pixel circuits for driving a plurality of micro light emitting diodes (micro LEDs) 130-1, 130-2 and 130-3 included in each of a plurality of pixels of the display panel 100.

The plurality of pixel circuits may be electrically connected to of the plurality of respective micro LEDs. Each of the plurality of pixel circuits may include a pulse amplitude modulation (PAM) circuit, a pulse width modulation (PWM) circuit, a current source, a transistor, and the like.

Referring to FIG. 2A, the micro LEDs 130-1, 130-2 and 130-3 may be formed on one of the surfaces of the circuit layer 120 that is opposite to the surface contacting the glass 110. Each of the micro LEDs may be any one of red (R), green (G) and blue (B) sub-pixels, and the R, G and B sub-pixels may be combined to form one pixel.

The micro LEDs formed on the circuit layer 120 may be any of flip-chip type micro LEDs, lateral type micro LEDs, and vertical type micro LEDs.

The circuit layer 120 may also include driving, circuits that supply driving signals for driving the plurality of pixel circuits based on signals received from a driver.

For example, the driving circuits may be connected to the driver formed on the other surface of the glass 110 via wiring formed over a side surface of the glass 110 to receive signals and generate driving signals based on the received signals. Specifically, the driving circuits may be respectively connected to data terminals of the driver through wiring lines formed on the side surface.

The circuit layer 120 may be formed as a thin film transistor (TFT) layer by implementing the plurality of pixel circuits and driving circuits as TFT.

The plurality of pixels configuring the display panel 100 may be arranged in a matrix form on the display panel 100. In addition, the driving circuits in the circuit layer 120 may include first driving circuits for driving corresponding pixel circuits for each row of the matrix and second driving circuits for driving corresponding pixel circuits for each column of the matrix.

Specifically, the first driving circuits may be gate drivers sequentially supplying driving signals for driving the plurality of pixel circuits for each row of the matrix based on one or more clock signals received from the driver. Here, the gate drivers may be arranged in a gate-in-panel form in which they are included in the circuit layer 120 within the panel.

The second driving circuits may be multiplexer (MUX) circuits configured to sequentially select respective pixel circuits corresponding to red (R), green (G) and blue (B) sub-pixels that constitute each pixel included in a row to which driving signals are supplied from the first driving circuits based on one or more clock signals received from the driver. The second driving circuits may sequentially supply data signals received from the driver to the selected pixel circuits.

For example, the clock signals supplied from the driver to the first driving circuits and the clock signals supplied from the driver to the second driving circuits may be different from each other, and the data signals supplied to the second driving circuits may be data of one or more images to be displayed through the display panel 100.

In addition, to solve the above-described problem, the circuit layer 120 may further include redundancy driving circuits connected to the respective driving circuits in parallel, and having the same circuit structure as the respective driving circuits.

Specifically, the redundancy driving circuits may be connected via additional wiring lines through which the driving circuits receive signals from the driver and lines through which the driving circuits supply driving signals to the plurality of pixel circuits, and may have the same circuit structure as the driving circuits.

The redundancy driving circuits will be described in more detail with respect to FIG. 2B.

In FIG. 2B, a display panel 100' may include a side wiring 140 and a driver 150 in addition to the glass 110 and the circuit layer 120 described above with regard to the display panel 100 of FIG. 2A.

Here, the driver 150 may be formed on the other surface of the glass 110, that is, on a surface opposite to the surface that is in contact with the circuit layer 120, while being connected to the circuit layer 120, via the side wiring 140.

The driver 150 may include a clock supply circuit for supplying clock signals to the driving circuits in the circuit layer 120, a data driver (or a source driver) for supplying information on a data voltage (e.g., an amplitude setting voltage or a pulse width setting voltage) for each pixel or each sub-pixel of the display panel 100, or the like.

In addition, the driver 150 may include a circuit structure for supplying, to the driving circuits, signals required for the driving circuits to drive the plurality of pixel circuits.

The plurality of pixel circuits included in the circuit layer 120 may be driven basically based on driving signals received from the driving circuits and the redundancy driving circuits.

When an abnormality occurs in any one of a driving circuit for driving specific pixel circuits and a redundancy driving circuit, it may be required that the pixel circuits be driven only through one of the operating driving circuits.

The abnormality in any one of the driving circuits (or the redundancy driving circuits) means that any two lines among lines connected to the driving circuits for signals or driving signals are short-circuited with respect to each other or one or more lines are opened. In addition, the abnormality may include a case where a connection between a source and a drain of a transistor included in the relevant driving circuit is opened. For example, there may be a case where the source and a gate are short-circuited or a case where the drain and the gate are short-circuited, or the like. However, the abnormality is not limited to the above-described examples, and may include various phenomena and events where the driving circuit does not operate normally.

When an abnormality occurs in any one of the driving circuits, it may be required that the abnormal driving circuit be stopped from operating, and the relevant pixel circuits be driven only through a redundancy driving circuit corresponding to the abnormal driving circuit. It is thus necessary to open all of the lines that are connected to the abnormal drive circuit for signals or driving signals.

As a result, when a connection between a driving circuit and a pixel circuit is opened, the pixel circuit may be driven based on a driving signal received from a redundancy driving circuit corresponding to the driving circuit to which the connection is opened.

Conversely, when an abnormality occurs in one of the redundancy driving circuits, and as a result a connection between the redundancy driving circuit and a pixel circuit is opened, the pixel circuit may be driven based on a driving signal received from one of the driving circuits corresponding to the redundancy driving circuit to which the connection is opened.

More specific examples will be described with reference to FIGS. 3, 4, and 5.

Figure 3:
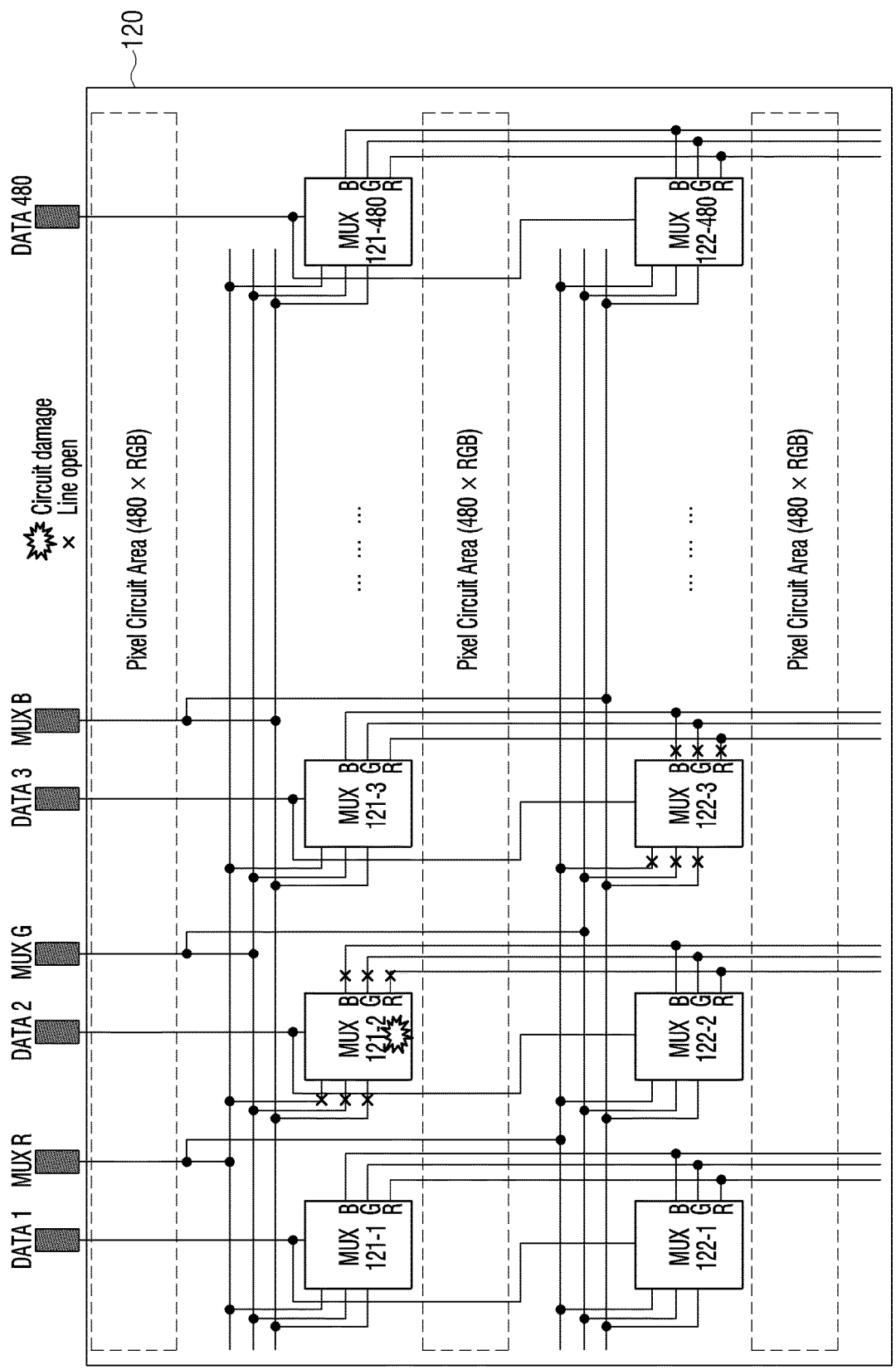
FIG. 3 is a diagram illustrating an example in which a display panel that includes a plurality of redundancy multiplexer (MUX) circuits for a plurality of MUX circuits according to an embodiment.

FIG. 3 is a diagram illustrating an example in which the display panel 100 according to an embodiment of the disclosure includes a plurality of redundancy MUX circuits for a plurality of MUX circuits. In FIG. 3, it may be assumed that the number of pixel columns of the display panel 100 is 480.

Referring to FIG. 3, the circuit layer 120 may include pixel circuit areas in which pixel circuits corresponding to pixels for each row are included, and may include a plurality of MUX circuits 121-1, 121-2, . . . , and 121-480 for driving pixel circuits corresponding to pixels of each column.

Here, the MUX circuits 121-1, 121-2, . . . , and 121-480 may receive respective data signals DMA 1, 2, 3, . . . , and 480 from the driver 151). The data signals DATA 1, 2, 3, . . . , and 480 may be data including information on images to be displayed.

In addition, the MUX circuits 121-1, 121-2, . . . , and 121-480 may apply the data signals DATA 1, 2, 3, . . . , and 480 to the plurality of pixel circuits according to clock signals MUX R, MUX G and MUX B for controlling respective driving timings of R, G and B sub-pixels.

However, FIG. 3 merely illustrates an example of signals for operating the MUX circuits, and is not intended to limit the type and the number of signals that the MUX circuits receive from the driver 30.

Referring to FIG. 3, the circuit layer 120 may further include redundancy MUX circuits 122-1, 122-2, . . . , and 122-480 having not only the same input and output, but also the same circuit structure as the MUX circuits 121-1, 121-2, . . . , and 121-480, respectively.

In this case, before the driver 30 is formed on the rear surface of the glass 110, even if any one of a specific MUX circuit and a redundancy MUX circuit is damaged, pixel circuits in the corresponding column may be controlled through the other one, thereby enabling an easy repair.

For example, as illustrated in FIG. 3, when there is no abnormality in any of the MUX circuit 121-1 and the redundancy MUX circuit 122-1, pixel circuits corresponding to pixels in a first column of the matrix may be driven by both the MUX circuit 121-1 and the redundancy MUX circuit 122-1 that are connected to each other in parallel.

On the other hand, referring to FIG. 3, when the MUX circuit 121-2 is damaged, a connection thereto may be opened so that the driver 30 and the pixel circuits are not connected to the damaged MUX circuit 121-2 during a process. As a result, pixel circuits corresponding to a second column may be driven through the redundancy MUX circuit 122-2. Accordingly, the problem may be solved by simply opening a connection to a relevant part without having to specifically repair the MUX circuit 121-2 itself.

In addition, if a redundancy MUX circuit is damaged rather than a MUX circuit, it is only required to open a connection to the damaged redundancy MUX circuit in a similar manner as described above. Referring to FIG. 3, when a redundancy MUX circuit 122-3 is damaged, it is still possible to drive pixel circuits corresponding to a third column through a MUX circuit 121-3 by opening a connection to the redundancy MUX circuit 122-3.

In FIG. 3, it may be required that a difference between magnitudes of voltages applied to pixel circuits in different columns should be minimized when the pixel circuits are driven through both the MUX circuit and the redundancy MUX circuit and when the pixel circuits are driven by only one of the MUX circuit and the redundancy MUX circuit.

Figure 4:
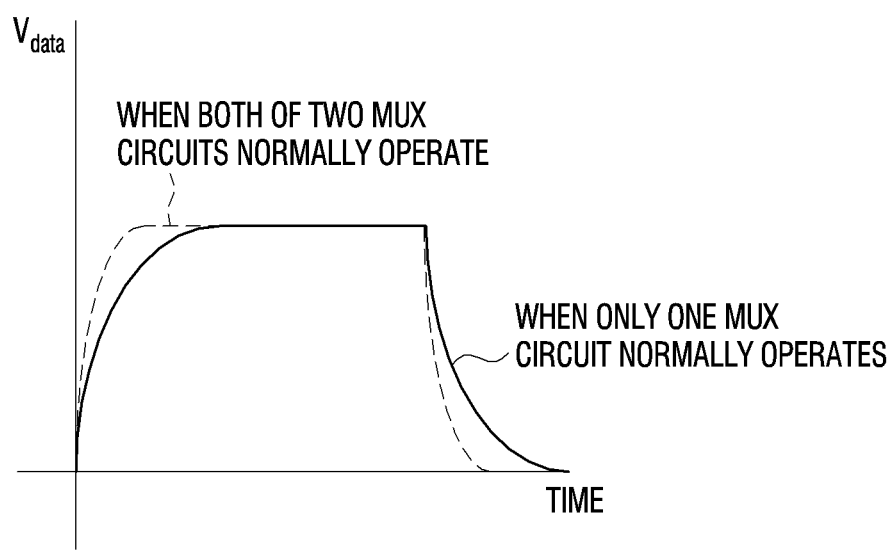
FIG. 4 is a graph illustrating a voltage applied to a pixel circuit when both specific MUX circuit and redundant MUX circuit operate or when only one of them operates according to an embodiment.

In this regard, FIG. 4 is a graph illustrating voltages applied to pixel circuits when both a specific MUX circuit and a corresponding redundant MUX circuit included in the circuit layer 120 operate or when only one of them operates.

Referring to FIG. 4, it may be seen that the maximum magnitude of the voltage $V_{data}$ applied to the pixel circuits is substantially the same between when both the MUX circuit and the corresponding redundant MUX circuit operate and when only one of them operates.

In addition, referring to FIG. 4, it may be seen that when both the MUX circuit and the redundant MUX circuit operate, it takes shorter time for $V_{data}$ to reach the maximum/minimum value.

Figure 5:
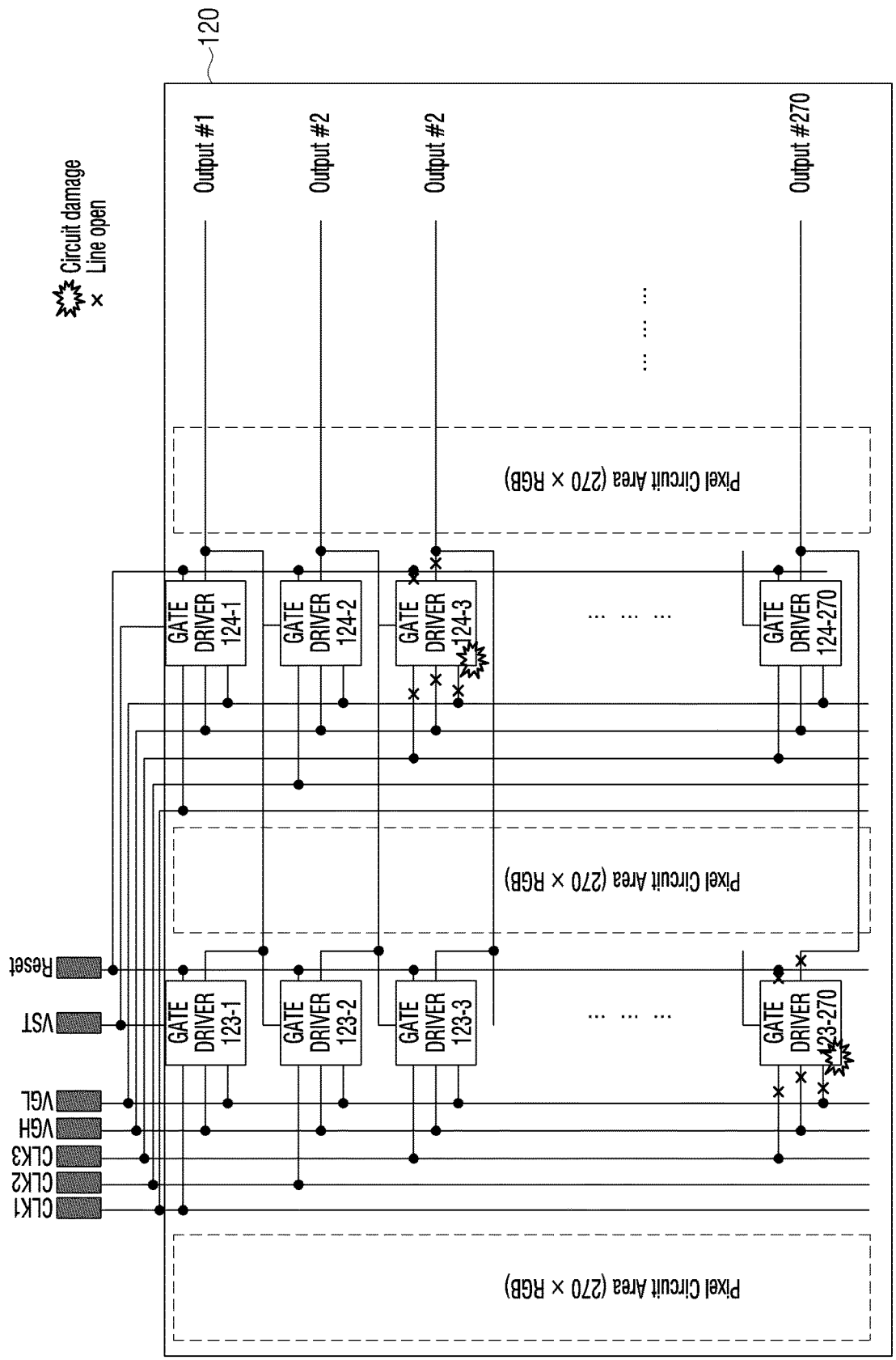
FIG. 5 is a diagram illustrating an example in which a display panel according to an embodiment of the disclosure includes a plurality of redundancy gate drivers for a plurality of gate drivers.

FIG. 5 is a diagram illustrating an example in which the display panel 100 according to an embodiment of the disclosure includes a plurality of redundancy gate drivers for a plurality of gate drivers. In FIG. 5, it is assumed that the number of pixel rows of the display panel 100 is 270.

Referring to FIG. 5, the circuit layer 120 includes pixel circuit areas in which pixel circuits corresponding to pixels for each column are included, and includes gate drivers 123-1, 123-2, . . . , and 123-270 for driving pixel circuits corresponding to pixels for each column.

Referring to FIG. 5, the gate drivers 123-1, 123-2, . . . , and 123-270 may generate respective waveforms corresponding to timings for the gate drivers 123-1, 123-2, . . . , and 123-270 to drive the pixel circuits, according to clock signals CLK 1, CLK2 and CLK 3, which the three gate drivers 123-1, 123-2 and 123-3 receive from the driver 30 respectively, and VGH (a direct current high voltage signal) and VGL (a direct current low voltage signal), which all of the gate drivers 123-1, 123-2, . . . , and 123-270 receive from the driver 30.

In this case, once the first gate driver 123-1 receives a start signal VST supplied from the driver 30, the gate drivers 123-1, 123-2, . . . , and 123-270 may drive pixel circuits corresponding to the respective columns while sequentially transmitting signals from the first gate driver 123-1 until reaching the last gate driver 123-270.

Meanwhile, FIG. 5 merely illustrates an example of signals for operating the gate drivers, and is not intended to limit the type and the number of signals that the gate drivers receive from the driver 30.

Referring to FIG. 5, the circuit layer 120 may further include redundancy gate drivers 124-1, 124-2, . . . , and 124-270 having not only the same input and output, but also the same circuit structure as the gate drivers 123-1, 123-2, . . . , and 123-270, respectively.

In this case, before the driver 30 is formed on the rear surface of the glass 110, even if any one of a specific gate driver or a corresponding redundancy gate driver is damaged, pixel circuits in the relevant row may be controlled through the other one, thereby enabling an easy repair.

For example, as illustrated in FIG. 5, when none of the gate driver 123-1 and the redundancy gate driver 124-1 is damaged, pixel circuits corresponding to pixels in a first row of the matrix may be driven by both the gate driver 123-1 and the redundancy gate driver 124-1 that are connected to each other in parallel.

On the other hand, referring to FIG. 5, when the gate driver 123-270 is damaged, a connection thereto may be opened so that the driver 30 and the pixel circuits are not connected to the damaged gate driver 123-270 during a process. As a result, pixel circuits corresponding to a 270th row may be driven through the redundancy gate driver 124-270. That is, the problem may Be solved by simply opening a connection to a relevant part without having to specifically repair the damaged gate driver 123-270 itself.

However, if a redundancy gate driver is damaged rather than a gate driver, it is merely required to open a connection to the damaged redundancy gate driver likewise. For example, when the redundancy gate driver 124-3 is damaged, it is possible to drive pixel circuits corresponding to a third row through the gate driver 123-3 by opening a connection to the redundancy gate driver 124-3.

Here, the arrangement of the driving circuits (gate drivers, redundancy gate drivers, MUX circuits and redundancy MUX circuits) and pixel circuits (within the pixel circuit areas) in the circuit layer 120 as illustrated in FIGS. 3 and 5 are merely an example, and are not limited thereto. The pixel circuits and the driving circuits may be arranged at various positions and in various manners in the circuit layer 120.

In addition, the respective redundancy driving circuits for the driving circuits may be included in the same number as the driving circuits, and there is no requirement that the redundancy driving circuits for all of the driving circuits be included in the circuit layer 120. If the redundancy driving circuits for at least some of the driving circuits are included in the circuit layer 120, this may be considered as falling within the spirit of the disclosure.

In addition, unlike the embodiments described with reference to FIGS. 3 to 5, the redundancy driving circuits may be connected, in an insulated welding form, to lines through which the driving circuits receive signals from the driver 150 and to lines through which the driving circuits supply driving signals to the plurality of pixel circuits.

That is, metals for the lines described above may be welded to metals for the lines connected to the redundancy driving circuits with insulators interposed therebetween. If there is no abnormality in the driving circuits, the redundancy driving circuits do not operate and only the driving circuits operate, as long as there is no particular measure (e.g. removing the insulators in welded portions using a laser or the like).

Hereinafter, it will be described in detail with reference to FIGS. 6, 7A, 7B and 8.

Figure 6:
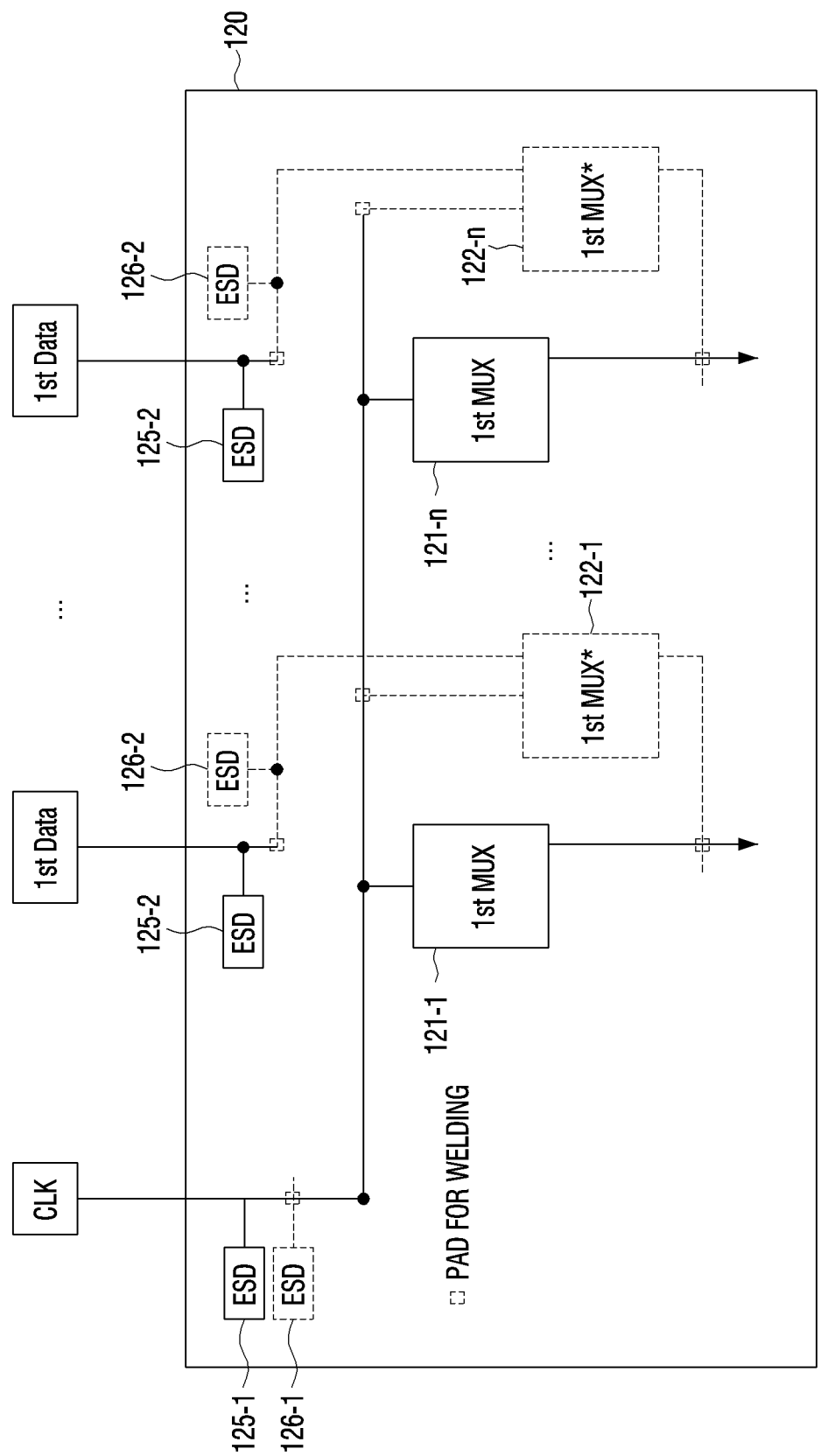
FIG. 6 is a diagram illustrating an example in which redundancy MUX circuits are connected to MUX circuits in an insulated welding form according to an embodiment.

FIG. 6 is a diagram illustrating an example in which the redundancy MUX circuits are connected to the MUX circuits in an insulated welding form. Although it is schematically illustrated in FIG. 6 that only one clock signal CLK is connected to the circuit layer 120, a plurality of clock signals may be connected thereto.

Referring to FIG. 6, the circuit layer 120 includes n MUX circuits 121-1, . . . , and 121-n and n redundancy MUX circuits 122-1, . . . , and 122-n. In addition, it may be seen that each of the redundancy MUX circuits 122-1, . . . , and 122-n is connected, in an insulated welding form, to a line for receiving a CLK signal from the driver 150 and to lines for the MUX circuits to supply driving signals to the plurality of pixel circuits.

If a MUX circuit 121-1 of the MUX circuits 121-1, . . . , and 121-n is damaged before the driver 150 is connected, a connection to the damaged MUX circuit 121-1 may be opened, while removing an insulating layer of the welded portion where the corresponding redundancy MUX circuit 122-1 is connected.

As a result, pixel circuits corresponding to pixels in a first column may be driven using the redundancy MUX circuit 122-1 instead of the damaged MUX circuit 121-1.

Figure 7A:
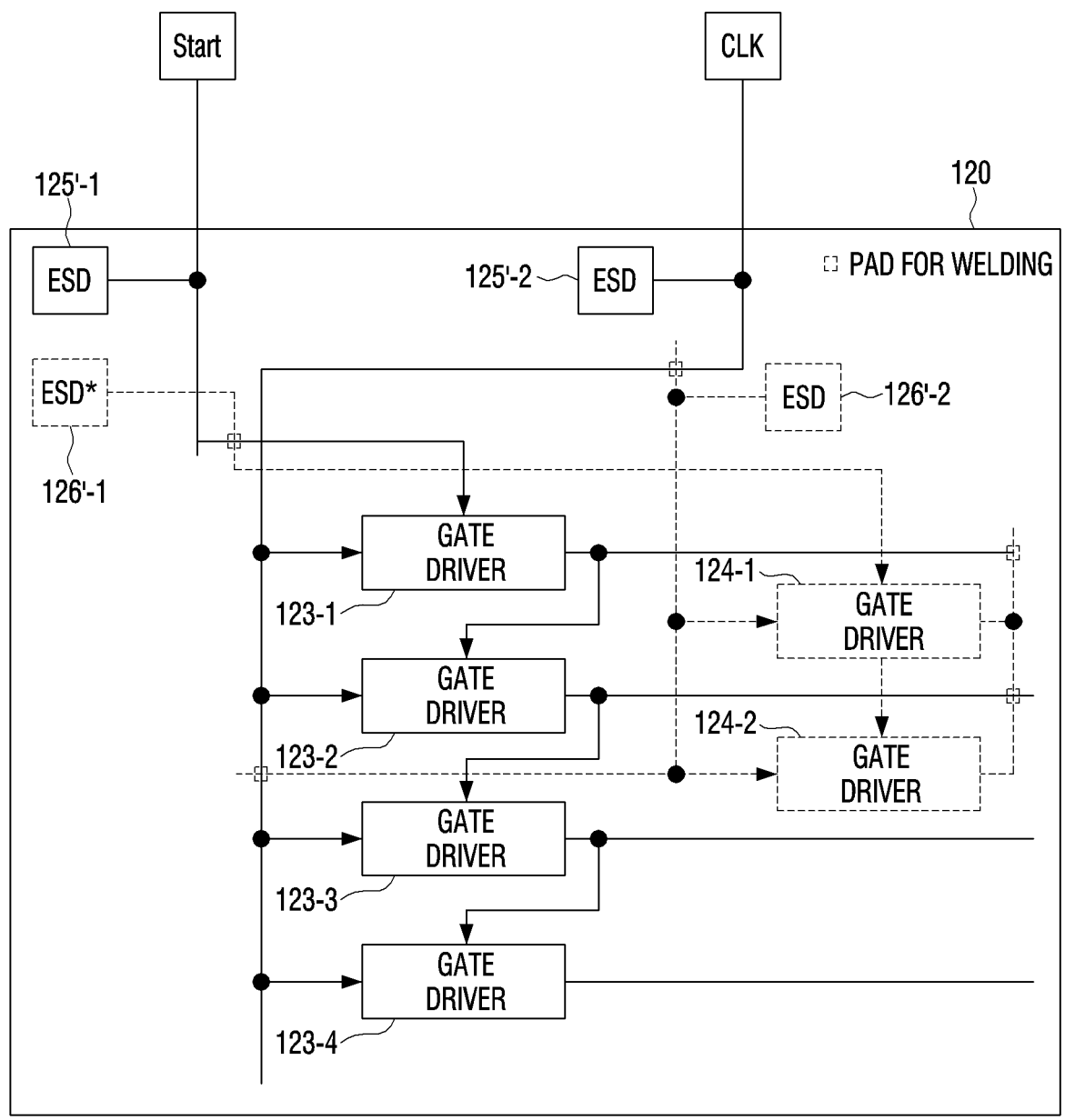
FIG. 7A is a diagram illustrating an example in which redundancy gate drivers are connected to gate drivers in an insulated welding form according to an embodiment.

FIG. 7A is a diagram illustrating an example in which the redundancy gate drivers are connected to the gate drivers in an insulated welding form. Unlike FIG. 6, FIG. 7A illustrates an embodiment in which there are two redundancy driving circuits for two driving circuits, rather than a redundancy driving circuit for each of the driving circuits.

Referring to FIG. 7A, the circuit layer 120 may include redundancy gate drivers 124-1 and 124-2 for specific gate drivers 123-1 and 123-2 among the gate drivers 123-1, 123-2, 123-3 and 123-4.

In this case, the gate drivers 123-1, 123-2, 123-3 and 123-4 may drive the plurality of pixel circuits using a start signal Start and a clock signal CLK (which may be a plurality of signals) received from the driver 150.

In contrast the redundancy gate drivers 124-1 and 124-2 may be connected in an insulated welding form to lines for signals received from the driver 150. Thus, the redundancy gate drivers 124-1 and 124-2 do not operate unless insulators in their welded portions are removed.

Referring to FIG. 7A, it may be seen that the redundancy gate drivers 124-1 and 124-2 are connected to replace the entirety of the gate drivers 123-1 and 123-2 with the redundancy gate drivers 124-1 and 124-2, rather than replacing the gate drivers 123-1 and 123-2 individually.

Figure 7B:
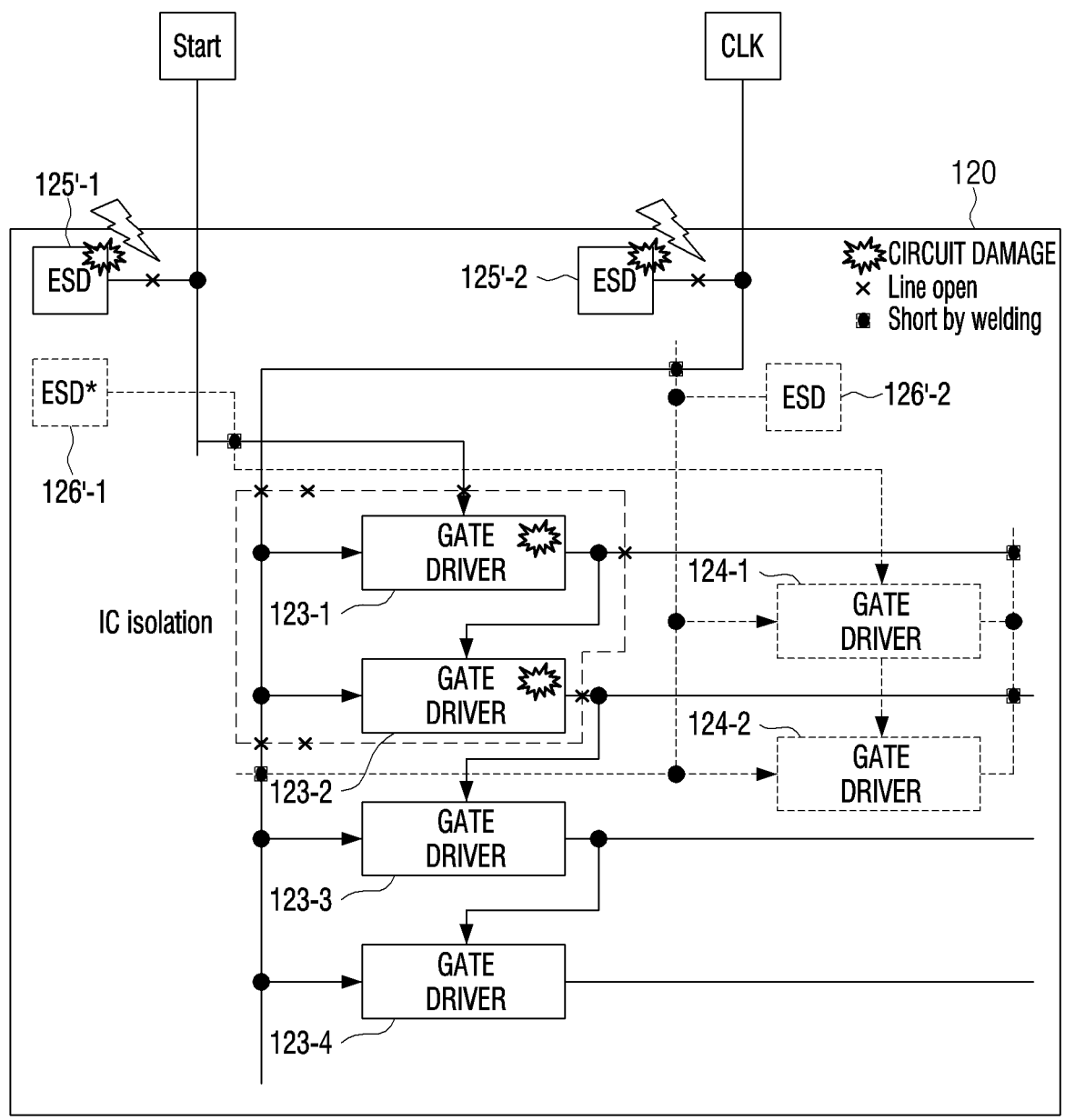
FIG. 7B is a diagram illustrating operations of the redundancy gate drivers when specific gate drivers are damaged in FIG. 7A according to an embodiment.

FIG. 7B is a diagram illustrating operations of the redundancy gate drivers when the specific gate drivers are damaged in FIG. 7A.

Referring to FIG. 7B, when at least one of the gate drivers 123-1 and 123-2 is damaged and a connection thereto is opened, pixel circuits corresponding to first and second rows of the matrix may be driven through the redundancy gate drivers 124-1 and 124-2 by removing the insulators in the welded portions thereof for the lines that are connected to the redundancy gate drivers 124-1 and 124-2.

Figure 8:
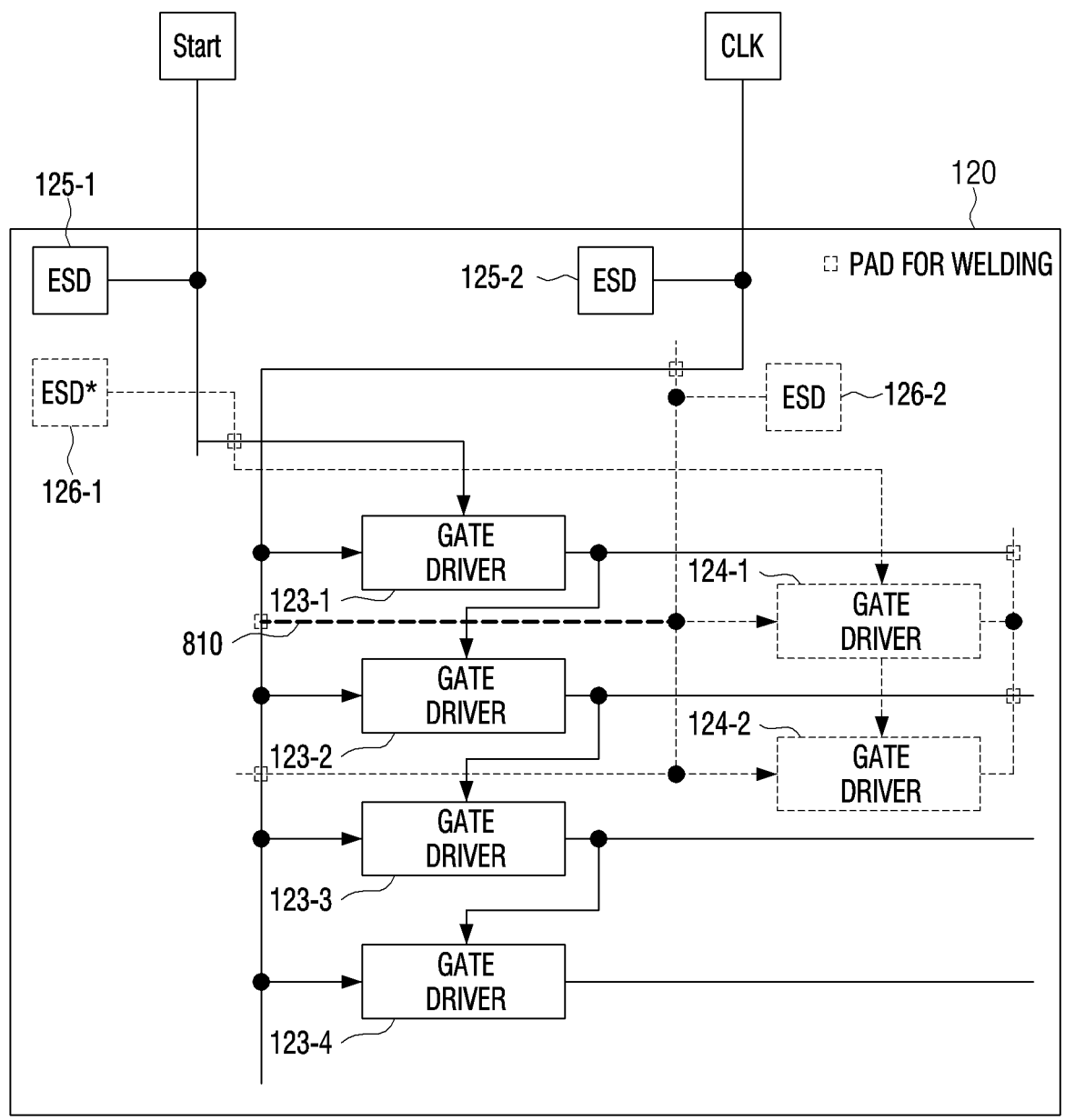
FIG. 8 is a diagram illustrating a circuit structure in which each redundancy gate driver may replace a respective gate driver according to an embodiment.

Referring to FIG. 8, unlike in FIG. 7A, each of the redundancy gate drivers 124-1 and 124-2 may be connected to replace each of the gate driver 123-1 or 123-2.

Unlike FIG. 7A, FIG. 8 is a diagram illustrates a circuit structure in which each redundancy gate driver may replace each gate drivel.

In FIG. 8, a line 810 is added so that even though only one of the gate drivers 123-1 and 123-2 is damaged, it is required to replace both the gate drivers 123-1 and 123-2 with the redundancy gate drivers 124-1 and 124-2. However, FIG. 7A is advantageous in that a circuit structure thereof is simpler than that of FIG. 8.

Although FIG. 8 only shows one line 810 being added, this is only for explaining a schematic structure. The number of added lines may vary depending on the number of lines (signals) connected from the driver 150 to the redundancy gate drivers 124-1 and 124-2.

Meanwhile, with regard to all the above-described embodiments in which the circuit layer 120 includes one or ore redundancy driving circuits, the circuit layer 120 may include one or more electrostatic discharge (ESD) circuits for preventing occurrence of static electricity in the display panel 100 and redundancy ESD circuits thereof.

The ESD circuit may be implemented as a diode, a zener diode, a around-gate N-channel MOSFET (GGNMOS), or the like.

The ESD circuit may be connected to at least one of the lines through which the driver circuits receive signals from the driver 150 to protect the driver circuits.

In addition, the redundancy ESD circuits may be connected to the respective ESD circuits in parallel to replace an ESD circuit as the ESD circuit is damaged. In this case, the ESD circuits and the redundancy ESD circuits may be connected in an insulated welding form.

Examples thereof are ESD circuits 125-1 and 125-2 and redundancy ESD circuits 126-1 and 126-2 in FIG. 6, and ESD circuits 125'-1 and 125'-2 and redundancy ESD circuits 126'-1 and 126'-2 in FIG. 7A.

Meanwhile, it is supposed in the above-described embodiments that the driving circuits are gate drivers or MUX circuits, but at least one of the gate drivers and the MUX circuits may be included in the driver 150 to be connected directly to a pixel circuit through the side wiring 140. Alternatively, it may also be supposed that at least one of the clock supply circuit and the data driver, which are described as being included in the driver 150, is one of the driving circuits included in the circuit layer 120.

Figure 9:
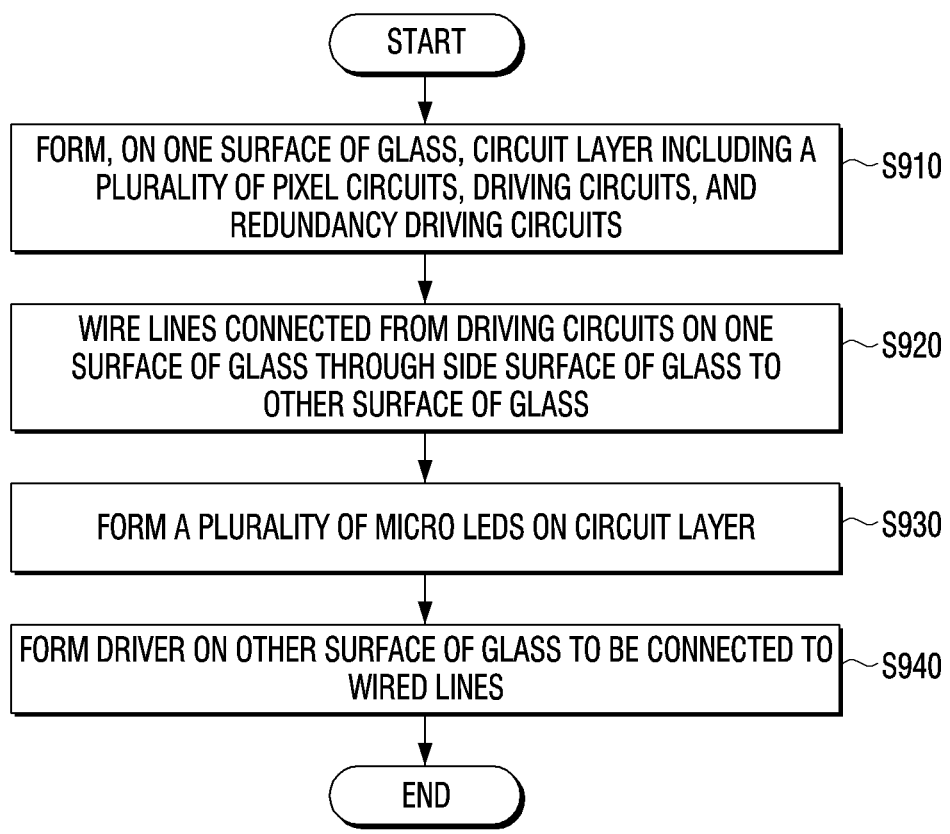
FIG. 9 is a flowchart illustrating a manufacturing method of a display panel according to an embodiment.

Hereinafter, a manufacturing method of a display panel according to the disclosure will be described with reference to FIG. 9. FIG. 9 is a flowchart illustrating a manufacturing method of a display panel according to an embodiment of the disclosure.

Referring to FIG. 9, in the manufacturing method, a circuit layer may be formed on one surface of a glass. The circuit layer may include a plurality of pixel circuits and driving circuits supplying driving signals for driving the plurality of pixel circuits to the plurality of pixel circuits based on signals received from a driver (S910). The plurality of pixel circuits are circuits connected to respective micro LEDs, which constitute pixels of the display panel, to apply a current/voltage to the micro LEDs.

In this case, the circuit layer may be formed to further include redundancy driving circuits having the same circuit structure as the driving circuits. However, there is no requirement that redundancy driving circuits be included for all of the driving circuits, and redundancy driving circuits may be provided for only some of the driving circuits.

In this case, the redundancy driving circuits may be connected via additional wiring to lines through which the driving circuits receive signals from the driver and to lines through which the driving circuits supply driving signals to the plurality of pixel circuits.

Meanwhile, the plurality of pixels of the display panel may be arranged in a matrix form. In this case, first driving circuits for driving corresponding pixel circuits for each row of the matrix and second driving circuits for driving corresponding pixel circuits for each column of the matrix mays be formed in the circuit layer.

Specifically, the first driving circuits may be formed as gate drivers for sequentially supplying driving signals for driving the plurality of pixel circuits for each row of the matrix based on a clock signal received from the driver.

In addition, the second driving circuits may be formed as MUX circuits for sequentially selecting respective pixel circuits corresponding to red (R), green (G) and blue (B) sub-pixels that form pixels included in a row to which driving signals are supplied from the first driving circuits based on a clock signal received from the driver, and sequentially supplying data signals received from the driver to the selected pixel circuits.

In addition, an electrostatic discharge (ESD) circuit for preventing static electricity of the display panel and a redundant ESD circuit for the ESD circuit may further be formed.

Here, the redundancy driving circuits and the redundancy ESD circuit may be designed to be connected in an insulated welding form to other lines on the circuit layer.

Then, lines connected from the driving circuits on one surface of the glass through a side surface of the glass to the other surface of the glass may be wired (S920).

Thereafter, each of a plurality of pixels of the display panel may be disposed on the circuit layer, and a plurality of micro LEDs driven by the plurality of pixel circuits may be formed therein (S930). Specifically, the plurality of micro LEDs may be attached onto the circuit layer by applying a uniform pressure such that the plurality of micro LEDs may be transferred evenly onto the circuit layer.

In this case, the plurality of pixels may be arranged in a matrix form on the display panel.

In addition, a driver may be formed on the other surface of the glass to be electrically connected to the wired lines (S940).

When an abnormality occurs in one of the driving circuits before operation S940, a connection between the driving circuit and a pixel circuit connected to the driving circuit may be opened.

As such, the relevant pixel circuit may be driven based on a driving signal received from a redundancy driving circuit corresponding to the abnormal driving circuit among the redundancy driving circuits.

Alternatively, when an abnormality occurs in one of the redundancy driving circuits before operation S940, a connection between the redundancy driving circuit and a pixel circuit connected to the redundancy driving circuit may be opened.

In this case, the corresponding pixel circuit may be driven based on a driving signal received from a driving circuit corresponding to the abnormal redundancy driving circuit among the driving circuits.

In operation S910, if the redundancy driving circuits are connected in the insulated welding form to other lines on the circuit layer, there may be a slight offset. As such, when an abnormality occurs in one of the driving circuits before operation S940, insulators of welded portions, in which the redundancy driving circuit for the abnormal driving circuit is connected, may be removed, in addition to the opening of the connection between the driving circuit and the pixel circuit connected to the driving circuit.

In this case, the relevant pixel circuit may be connected to the redundancy driving circuit corresponding to the abnormal driving circuit to be driven by the redundancy driving circuit.

The chip-on-glass (COG) type display panel according to the disclosure is advantageous in that even when a gate driver or a MUX circuit provided in a thin film transistor (TFT) layer on the glass is damaged due to an electrostatic discharge (ESD) in a manufacturing process thereof, redundancy circuits that have already been additionally provided in the TFT layer enable restoration in a simple way.

According to the various embodiments, each of the elements may be implemented as a single entity or a plurality of entities. The above-described sub elements may be partially omitted, or other sub elements may be further included in the various embodiments. Alternatively or additionally, after being integrated into a single entity, some of the elements may identically or similarly perform the respective functions as performed by the relevant elements before integration.

According to the various embodiments, operations performed by modules, programs, or other elements may be executed sequentially, in parallel, repeatedly, or heuristically, or at least some of the operations may be executed in a different order or omitted, or other operations may be added.

While embodiments of the disclosure have been illustratively described hereinabove, various changes and modifications may be made by one having ordinary skill in the art without departing from the essential characteristics of the disclosure. Also, the embodiments of the disclosure are not intended to limit the spirit of the disclosure, but are to describe the spirit of the disclosure, and the spirit and the scope of the disclosure are not limited by the embodiments. Accordingly, the scope of the disclosure should be construed based on the following claims, and it is to be construed that all equivalents thereto fall within the scope of the disclosure.

What is claimed is:

1. A display panel in which pixels are arranged in a matrix, each pixel comprising a plurality of sub-pixels, the display panel comprising:
a glass;
a driver disposed on a first surface of the glass; and
a circuit layer formed on a second surface of the glass, the circuit layer comprising:
a plurality of pixel circuits corresponding to the plurality of sub-pixels of the display panel, the plurality of sub-pixels comprising a plurality of micro light emitting diodes (LEDs) respectively;
a plurality of driving circuits which are respectively connected to the driver via wiring formed over at least one side surface of the glass, and configured to drive the plurality of pixel circuits based on signals received from the driver; and
a plurality of redundancy driving circuits which are respectively connected to the plurality of driving circuits in parallel, the plurality of redundancy driving circuits having a same circuit structure as the plurality of driving circuits,
wherein the plurality of driving circuits comprise multiplexer circuits, and
wherein the plurality of redundancy driving circuits comprise redundancy multiplexer circuits that are same as the multiplexer circuits.

2. The display panel according to claim 1, wherein the plurality of redundancy driving circuits are connected, via additional wiring, to the driver and to the plurality of pixel circuits that are respectively connected to the plurality of driving circuits, and
wherein the plurality of pixel circuits are configured to be driven based on driving signals received from the plurality of driving circuits and the plurality of redundancy driving circuits.

3. The display panel according to claim 1, wherein, based on a connection between a first driving circuit of the plurality of driving circuits and a first pixel circuit of the plurality of pixel circuits being opened, the first pixel circuit is configured to be driven by a driving signal received from a first redundancy driving circuit, among the plurality of redundancy driving circuits, corresponding to the first driving circuit.

4. The display panel according to claim 1, wherein, based on a connection between a first redundancy driving circuit of the plurality of redundancy driving circuits and a first pixel circuit of the plurality of pixel circuits being opened, the first pixel circuit is configured to be driven based on a driving signal received from a first driving circuit, among the plurality of driving circuits, corresponding to the first redundancy driving circuit.

5. The display panel according to claim 1, wherein the plurality of redundancy driving circuits are connected, in an insulated welding form, to the driver and to the plurality of pixel circuits.

6. The display panel according to claim 1, wherein the plurality of driving circuits comprise a first group of the plurality of driving circuits for driving corresponding pixel circuits for each row of the matrix and a second group of the plurality of driving circuits for driving corresponding pixel circuits for each column of the matrix.

7. The display panel according to claim 6, wherein the first group of the plurality of driving circuits are configured to sequentially supply driving signals for driving the pixel circuits for each row of the matrix based on a clock signal received from the driver, and
wherein the second group of the plurality of driving circuits are configured to sequentially select pixel circuits corresponding to a red (R) sub-pixel, a green (G) sub-pixel and a blue (B) sub-pixel included in a row to which a driving signal is supplied from the first group based on the clock signal, and sequentially supply data signals received from the driver to the selected pixel circuits.

8. The display panel according to claim 1, wherein the circuit layer further comprises an electrostatic discharge (ESD) circuit configured to prevent static electricity of the display panel and a redundancy ESD circuit corresponding to the ESD circuit.

9. A method of manufacturing a display panel, the method comprising:
   forming a circuit layer on a first surface of a glass, the circuit layer including a plurality of pixel circuits, a plurality of driving circuits configured to drive the plurality of pixel circuits, and a plurality of redundancy driving circuits which are respectively connected in parallel to the plurality of driving circuits with a same circuit structure;
   forming wiring lines connected from the plurality of driving circuits on the first surface of the glass through at least one side surface of the glass to a second surface of the glass, respectively;
   forming a plurality of micro light emitting diodes (LEDs) corresponding to a plurality of sub-pixels of the display panel respectively on the circuit layer to be driven respectively by the plurality of pixel circuits; and
   disposing a driver on the second surface of the glass to be electrically connected to the wiring lines connected to the plurality of driving circuits,
   wherein the plurality of driving circuits comprise multiplexer circuits, and
   wherein the plurality of redundancy driving circuits comprise redundancy multiplexer circuits that are same as the multiplexer circuits.

10. The method according to claim 9, further comprising, based on an abnormality occurring in a first driving circuit of the plurality of driving circuits, opening a connection between the first driving circuit and a first pixel circuit among the plurality of pixel circuits connected to the first driving circuit,
   wherein the first pixel circuit is configured to be driven based on a driving signal received from a first redundancy driving circuit among the plurality of redundancy driving circuits corresponding to the first driving circuit.

11. The method according to claim 9, further comprising, based on an abnormality occurring in a first redundancy driving circuit of the plurality of redundancy driving circuits, opening a connection between the first redundancy driving circuit and a first pixel circuit among the plurality of pixel circuits connected to the first redundancy driving circuit,
   wherein the first pixel circuit is configured to be driven based on a driving signal received from a first driving circuit among the plurality of driving circuits corresponding to the first redundancy driving circuit.

12. The method according to claim 9, wherein each of a plurality of pixels arranged in a matrix on the display panel comprises the plurality of sub-pixels, and
   wherein the forming of the circuit layer further comprises forming a first group of the plurality of driving circuits configured to drive corresponding pixel circuits for each row of the matrix and a second group of the plurality of driving circuits configured to drive corresponding pixel circuits for each column of the matrix.

13. The method according to claim 12, wherein the forming of the circuit layer further comprises:
   forming the first group of the plurality of driving circuits to sequentially supply driving signals for driving the pixel circuits for each row of the matrix based on a clock signal received from the driver, and
   forming the second group of the plurality of driving circuits to sequentially select pixel circuits corresponding to a red (R) sub-pixel, a green (G) sub-pixel and a blue (B) sub-pixel included in a row to which a driving signal is supplied from the first group of the plurality of driving circuits based on the clock signal, and to sequentially supply data signals received from the driver to the selected pixel circuits.

14. The method according to claim 9, wherein the forming of the circuit layer further comprises forming an electrostatic discharge (ESD) circuit configured to prevent static electricity of the display panel and a redundancy ESD circuit for the ESD circuit.

15. A method for driving a plurality of micro light emitting diodes (LEDs) in a display panel in which pixels are arranged in a matrix, each pixel comprising a plurality of sub-pixels, the display panel comprising a glass, a driver disposed on a first surface of the glass and a circuit layer formed on the glass, the method comprising:
   generating, by a plurality of driving circuits and a plurality of redundancy driving circuits included in the circuit layer, driving signals based on signals received from the driver; and
   supplying the driving signals to a plurality of pixel circuits for driving the plurality of micro LEDs, wherein the plurality of pixel circuits corresponding to the plurality of sub-pixels of the display panel, the plurality of sub-pixels comprising the plurality of micro LEDs respectively,
   wherein the plurality of redundancy driving circuits are respectively connected to the plurality of driving circuits in parallel, the plurality of redundancy driving circuits having a same circuit structure as the plurality of driving circuits,
   wherein the plurality of driving circuits and the plurality of redundancy driving circuits are respectively connected to the driver via wiring formed over at least one side surface of the glass,
   wherein the plurality of driving circuits comprise multiplexer circuits, and
   wherein the plurality of redundancy driving circuits comprise redundancy multiplexer circuits that are same as the multiplexer circuits.

16. The method according to claim 15, further comprising:
   based on a connection between a first driving circuit of the plurality of driving circuits and a first pixel circuit of the plurality of pixel circuits being opened, generating, by a first redundancy driving circuit among the plurality of redundancy driving circuits corresponding to the first driving circuit, a driving signal for driving the first pixel circuit of the plurality of pixel circuits; and
   supplying, by the first redundancy driving circuit, the driving signal to the first pixel circuit.

17. The method according to claim 15, further comprising:
   based on a connection between a first redundancy driving circuit of the plurality of redundancy driving circuits and a first pixel circuit of the plurality of pixel circuits being opened, generating, by a first driving circuit among the plurality of driving circuits corresponding to the first redundancy driving circuit, a driving signal for driving the first pixel circuit of the plurality of pixel circuits; and supplying, by the first driving circuit, the driving signal to the first pixel circuit.

18. The display panel according to claim 1, wherein each of the multiplexer circuits is configured to select a pixel circuit to which a driving signal is to be applied among the plurality of pixel circuits.

19. The display panel according to claim 1, wherein the matrix comprises a plurality of rows, wherein the circuit layer further comprises gate drivers, and wherein each of the gate drivers is configured to drive pixel circuits in each row.

* * * * *